(12) United States Patent
Gandhi et al.

(10) Patent No.: US 10,319,606 B1
(45) Date of Patent: Jun. 11, 2019

(54) CHIP PACKAGE ASSEMBLY WITH ENHANCED INTERCONNECTS AND METHOD FOR FABRICATING THE SAME

(71) Applicant: Xilinx, Inc., San Jose, CA (US)

(72) Inventors: Jaspreet Singh Gandhi, San Jose, CA (US); Tien-Yu Lee, San Jose, CA (US); Henley Liu, San Jose, CA (US); Ivor G. Barber, Los Gatos, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 5 days.

(21) Appl. No.: 15/813,008

(22) Filed: Nov. 14, 2017

(51) Int. Cl.
| | |
|---|---|
| *H01L 23/48* | (2006.01) |
| *H01L 23/498* | (2006.01) |
| *H05K 1/11* | (2006.01) |
| *H01L 21/48* | (2006.01) |
| *H01L 23/00* | (2006.01) |
| *H01L 23/50* | (2006.01) |
| *H01L 23/14* | (2006.01) |

(52) U.S. Cl.
CPC ........ *H01L 21/4853* (2013.01); *H01L 23/147* (2013.01); *H01L 23/49827* (2013.01); *H01L 23/50* (2013.01); *H01L 24/16* (2013.01); *H01L 24/48* (2013.01); *H01L 24/73* (2013.01); *H01L 24/75* (2013.01); *H01L 24/81* (2013.01)

(58) Field of Classification Search
CPC ......... H01L 24/12; H01L 24/81; H01L 24/05; H01L 2224/13111; H01L 2224/16237; H01L 23/13; H01L 2924/00; H01L 24/48; H01L 24/29
See application file for complete search history.

(56) References Cited

U.S. PATENT DOCUMENTS

| | | | |
|---|---|---|---|
| 5,889,655 A * | 3/1999 | Barrow ............. | H01L 23/49816 228/180.22 |
| 7,378,733 B1 | 5/2008 | Hoang et al. | |
| 7,696,006 B1 | 4/2010 | Hoang et al. | |
| 8,618,648 B1 | 12/2013 | Kwon et al. | |
| 9,006,030 B1 | 4/2015 | Kwon et al. | |
| 9,147,661 B1 | 9/2015 | Kwon et al. | |
| 9,508,563 B2 | 11/2016 | Kwon et al. | |
| 2001/0015285 A1* | 8/2001 | Nakayama ........ | H01L 23/49816 174/250 |
| 2005/0184371 A1* | 8/2005 | Yang ................. | H01L 23/49816 257/678 |
| 2007/0222053 A1* | 9/2007 | Wei ...................... | H01L 21/6835 257/686 |
| 2015/0102482 A1* | 4/2015 | Liu ................... | H01L 21/76805 257/737 |
| 2017/0018489 A1 | 1/2017 | Gandhi et al. | |

\* cited by examiner

*Primary Examiner* — Caridad Everhart
(74) *Attorney, Agent, or Firm* — Keith Taboada; Adam Davenport

(57) ABSTRACT

An integrated circuit interconnects are described herein that are suitable for forming integrated circuit chip packages. In one example, an integrated circuit interconnect is provided that includes a package substrate having a plurality of solder balls coupled to a plurality of contact pads. The package substrate includes a solder mask having a plurality of stepped openings, a plurality of contact pads, and circuitry disposed in the package substrate and coupled to the plurality of contact pads. The solder mask defines a top side of the package substrate. The stepped openings expose the contact pads through solder mask.

20 Claims, 8 Drawing Sheets

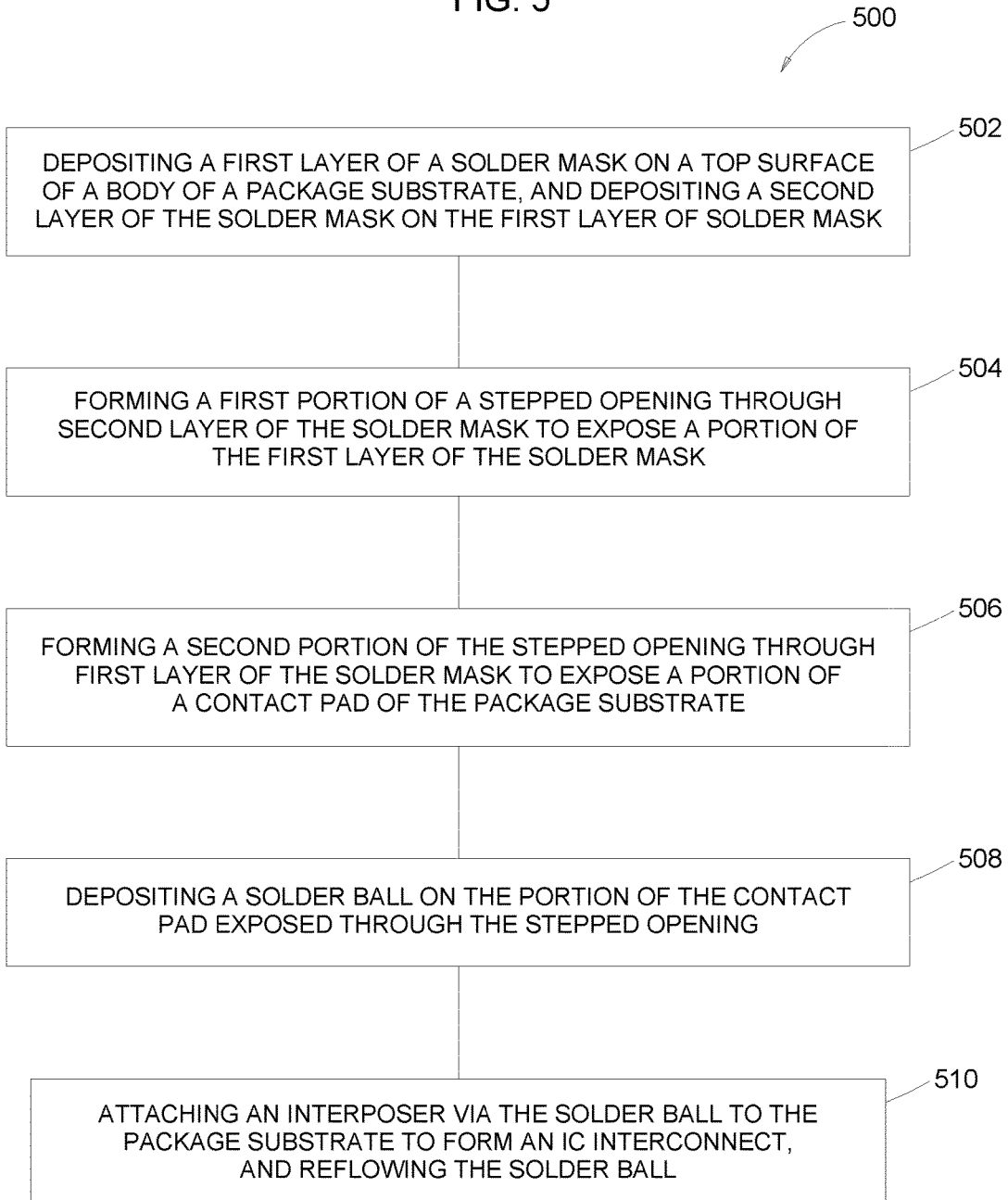

CHIP PACKAGE ASSEMBLY WITH ENHANCED INTERCONNECTS AND METHOD FOR FABRICATING THE SAME

BACKGROUND OF THE INVENTION

Field of the Invention

Implementations described herein generally relate to chip packaging, and in particular, to solder bump structures for a semiconductor device and methods of fabricating the same.

Description of the Related Art

An increasing demand for electronic equipment that is smaller, lighter, and more compact has resulted in a concomitant demand for semiconductor packages that have smaller outlines and mounting areas or "footprints." One response to this demand has been the development of the "flip-chip" method of attachment and connection of semiconductor chips or "dice" to substrates (e.g., PCBs or lead-frames). Flip-chip mounting involves the formation of bumped contacts (e.g., solder balls) on the active surface of the die, then inverting or "flipping" the die upside down and reflowing the bumped contacts (i.e., heating the bumped contacts to the melting point) to form solder joints fusing the bumped contacts to the corresponding pads on the substrate.

In flip-chip mounting and connection methods, thermomechanical reliability is becoming an increasing concern of the electronics industry. Notably, the reliability of the integrated circuit interconnects, e.g., solder joints, is one of the most critical issues for successful application of such mounting and connection methods. However, solder joints formed using known methods are prone to necking and bridging when formed at pitches smaller than 150 µm. Forming a robust solder connections between interposers and package substrate utilized in semiconductor packages is particularly challenging at such small pitches due to the differences in thermal expansion which present an undesirably high risk for cracking and bridging at high-stress points due to thermal stress cycling.

Therefore, there is a need for improved integrated circuit interconnects and methods of forming improved solder joints for an integrated circuit.

SUMMARY OF THE INVENTION

Integrated circuit interconnects are described herein that are suitable for forming integrated circuit chip packages. In one example, an integrated circuit interconnect is provided that includes a package substrate having body. A plurality of solder balls is coupled to a plurality of contact pads exposed on the body of the package substrate. The package substrate includes a plurality of contact pads, circuitry disposed in the package substrate and coupled to the plurality of contact pads, and a solder mask. The solder mask is disposed on the dielectric layer and define an exterior surface of the package substrate. The first solder mask has a plurality of openings that exposed the contact pads through the solder mask. The stepped openings of the solder mask having a stepped sidewall.

In one example, the stepped openings of the solder mask has a stepped sidewall, wherein the stepped sidewall is formed through a single layer of solder mask material. In another example, the stepped openings of the solder mask has a stepped sidewall that is formed through a multiple layers of solder mask material.

In another example, a method for forming an interconnect of an integrated circuit package is provided. The method includes depositing a solder mask on a package substrate, the package substrate comprising contact pad coupled to circuitry within the package substrate, forming a stepped opening through the solder mask to exposed one of the contact pads, and depositing a solder ball in the stepped opening, the solder ball electrically coupled to one of the contact pads.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5 is a partial sectional another embodiment of an IC interconnect that may be utilized to couple an interposer to a package substrate in a chip package.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the invention generally provide a chip package an improved integrated circuit interconnect between an interposer with at least one integrated circuit (IC) die and a package substrate, along with a method for fabricating the same. In particular, solder structures, e.g., IC interconnects, between the interposer and package substrate are disclosed which are less prone to necking and cracking even at pitches as small as 144 µm. Advantageously, the IC interconnects have demonstrated necking ratios greater than 1, and also be optionally formed without coining, thereby saving cost and process time over conventional solder interconnects. Furthermore, the IC interconnects may be formed at pitches as low as 144 µm utilizing the same solder volume as conventional interconnects formed for 180 µm pitch applications, thereby making the inventive IC interconnect less prone to intermetallic (IMC) brittleness associated with reduced solder volume. Thus, the inventive IC interconnect provides more robust and reliable signal transmission and better device performance over a wider range of operating conditions, with less expense and manufacturing complexity.

Figure 1:
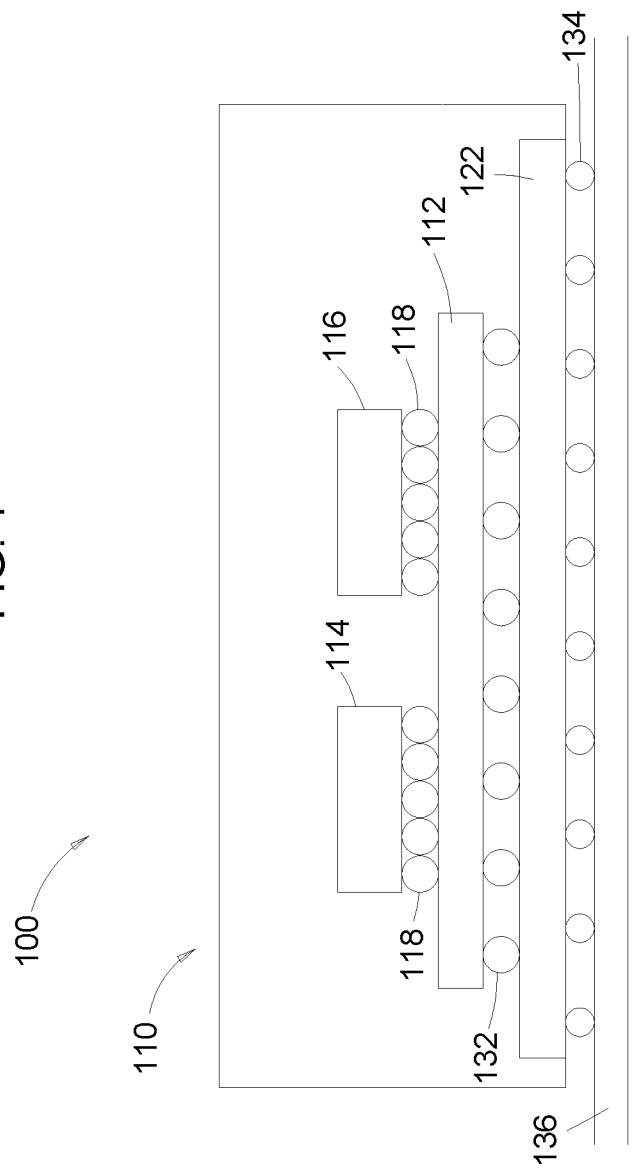
FIG. 1 is a front schematic view of an electronic device having an integrated chip package including at least one integrated circuit die.

Turning now to FIG. 1, an exemplary electronic device 100 is schematically illustrated. The electronic device 100 includes an integrated circuit chip package 110 coupled to a printed circuit board (PCB) 136. The electronic device 100 may be a computer, tablet, cell phone, smart phone, consumer appliance, control system, automated teller machine, programmable logic controller, printer, copier, digital camera, television, monitor, stereo, radio, radar, or other device incorporating the chip package 110.

The chip package 110 includes at least one integrated circuit (IC) die. In FIG. 1, a plurality of IC dice 114, 116 are shown connected by an interposer 112 to a package substrate 122. The chip package 110 may also have an overmold (not shown) covering the IC dice 114, 116. The interposer 112 may be a through-substrate-via (TSV) or a substrate-less interposer as commonly known in the art. The interposer 112 includes circuitry for electrically connecting the dice 114, 116 to circuitry of the package substrate 122. The circuitry of the interposer 112 may optionally include active or passive circuit elements.

The IC dice 114, 116 are mounted to one or more surfaces of the interposer 112. The IC dice 114, 116 may be programmable logic devices, such as field programmable gate arrays (FPGA), memory devices, optical devices, processors or other IC logic structures. Optical devices include photodetectors, lasers, optical sources, and the like. In the embodiment depicted in FIG. 1, the IC dice 114, 116 are mounted to a top surface of the interposer 112 by a plurality of micro-bumps 118. The micro-bumps 118 electrically connect the circuitry of each IC die 114, 116 to the circuitry of the interposer 112.

Integrated circuit (IC) interconnects 132, also known as "package bumps" or "C4 bumps," are utilized to provide an electrical connection between the circuitry of the interposer 112 and the circuitry of the package substrate 122. The package substrate 122 may be mounted and connected to the PCB 136 utilizing solder connections, wire bonding or other suitable technique. In the embodiment depicted in FIG. 1, the package substrate 122 is mounted to the PCB 136 using a plurality of solder balls 134.

The circuitry of the interposer 112 connects the micro-bumps 118 to selective interconnects 132, and hence, connects selective circuitry of each IC die 114, 116 to the package substrate 122, to enable communication of the dice 114, 116 with the PCB 136 after the chip package 110 is mounted within the electronic device 100.

As discussed above, the IC interconnects 132 are configured to mechanically and electrically connect the interposer 112 with the package substrate 122. One example of an exemplary IC interconnect 132 is further detailed below with reference to FIG. 2. The other IC interconnect 132 coupling the interposer 112 to the package substrate 122 may be similarly constructed.

Figure 2:
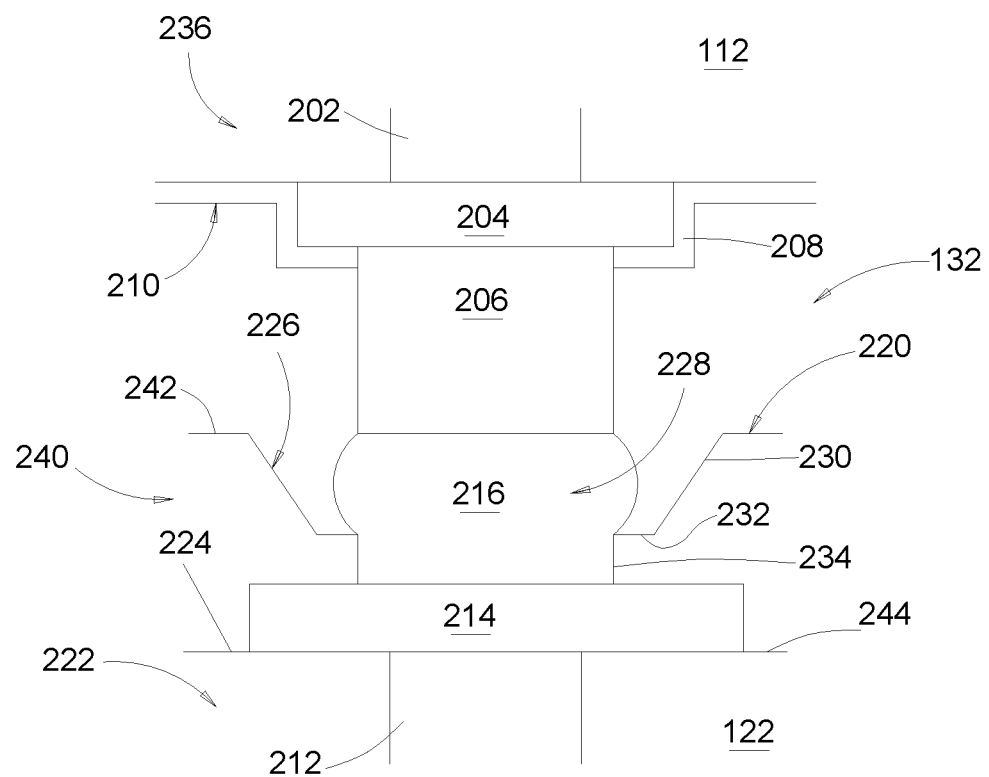
FIG. 2 is a partial sectional one embodiment of the IC interconnect coupling an interposer to a package substrate of the chip package of FIG. 1.

In the illustration of FIG. 2, a partial sectional one embodiment of the IC interconnect 132 depicted coupling the interposer 112 to the package substrate 122. The IC interconnect 132 is configured to provide robust and reliable high-speed signal transmission between circuitry 202 of the interposer 112 and circuitry 212 of the package substrate 122.

The interposer 112 has a body 236 through which the circuitry 202 is formed. The circuitry 202 is formed using the multiple metal and dielectric layers comprising the body 236 of the interposer 112. The circuitry 202 is coupled to the micro-bumps 118 disposed on a top side of the interposer 112, as shown in FIG. 1. The circuitry 202 terminates at a contact pad 204 formed on a bottom side 210 of the interposer 112. The contact pad 204 may be formed from copper or other suitable conductor. The contact pad 204 may be exposed through a passivation layer 208 deposited on the body 236 of the interposer 112. A conductive pillar 206 is coupled to the contact pad 204 through the opening formed in the passivation layer 208. The conductive pillar 206 may be fabricated from copper or other suitable conductive material, and may optionally include a plating layer. The plating layer may be formed from at least one of copper and nickel, among other materials.

The package substrate 122 has a body 222 through which the circuitry 212 is formed. The circuitry 212 is formed using the multiple metal and dielectric layers comprising the body 222 of the package substrate 122. A top surface 224 of the body 222 of the package substrate 122 is generally formed from a dielectric layer. The circuitry 212 is coupled to the solder balls 134 disposed on a bottom side of the package substrate 122, as shown in FIG. 1. The circuitry 212 terminates at a contact pad 214 formed on a top side 220 of the package substrate 122. The contact pad 214 may be formed from copper or other suitable conductor. The contact pad 204 may be exposed through a solder mask 240 deposited on a top surface 224 of the body 222 of the package substrate 122. A solder ball 216 is coupled to the contact pad 214 through a stepped opening 226 formed in the solder mask 240.

The stepped opening 226 formed in the solder mask 240 includes a first sidewall 230, a step 232, and a second sidewall 234. The first sidewall 230 extends between an exposed top surface 242 of the solder mask 240 and the step 232. The second sidewall 234 extends between the step 232 and a bottom surface 244 of the solder mask 240. The bottom surface 244 of the solder mask 240 is disposed in contact with the top surface 224 of the body 222.

The first sidewall 230 generally has a diameter greater than a diameter of the second sidewall 234. Described in another manner, the first sidewall 230 encompasses an area greater than an area encompassed by the second sidewall 234. The first sidewall 230 may have a vertical orientation relative to the plane of the top surface 224 of the body 222 of the interposer 112. However, in the embodiment depicted in FIG. 2, the first sidewall 230 may have an orientation that is not perpendicular to the plane of the top surface 224 of the body 222. For example, the first sidewall 230 may have an orientation that flares outward in a direction towards the top surface 242 of the solder mask 240. In the example depicted in FIG. 2, the portion of the first sidewall 230 terminating at the top surface 242 of the solder mask 240 has a diameter less than a diameter (or width) of the contact pad 214. The flared orientation advantageously allows for a more forgiving geometry (i.e., looser manufacturing tolerances) which accommodates greater misalignment between the contact pads 204, 214, while enhancing robust and reliable solder connections between the contact pads 204, 214 and the solder ball 216 forming the interconnect 132. In one example, the flare of the first sidewall 230 may be between about 90 to about 130 degrees.

The step 232, as discussed above, connects the first sidewall 230 to the second sidewall 234. The step 232 generally has, but is not limited to, an orientation that is parallel to the plane of the top surface 224 of the body 222. In one example, the step 232 is formed at about half a distance between the top surface 242 and the bottom surface 244 of the solder mask 240.

The second sidewall 234 defines an opening 228 that exposes the contact pad 214. The second sidewall 234 may have a vertical orientation relative to the plane of the top surface 224 of the body 222 of the interposer 112. Alternatively, the second sidewall 234 may have an orientation that is not perpendicular to the plane of the top surface 224 of the body 222. For example, the second sidewall 234 may have an orientation that flares outward in a direction towards the step 232 of the stepped opening 226 of the solder mask 240.

The solder mask 240 may be comprises a single layer of photoimageable material or multiple layers of photoimageable material. In the example depicted in FIG. 2, the solder mask 240 is comprised of a single layer of photoimageable material. Suitable photoimageable materials for forming the solder mask 240 include acrylic or polyimide plastic photoimageable materials, liquid photoimageable materials, dry photoimageable films, or alternatively, an epoxy resin that is silk screened or spin-coated on the top surface 224 of the body 222 of the package substrate 122. The photoimageable material comprising the solder mask 240 may be patterned using known photolithography techniques to define the stepped opening 226. It is contemplated that other techniques may be developed in the future that a suitable for forming the stepped opening 226 in the solder mask 240.

Figure 3:
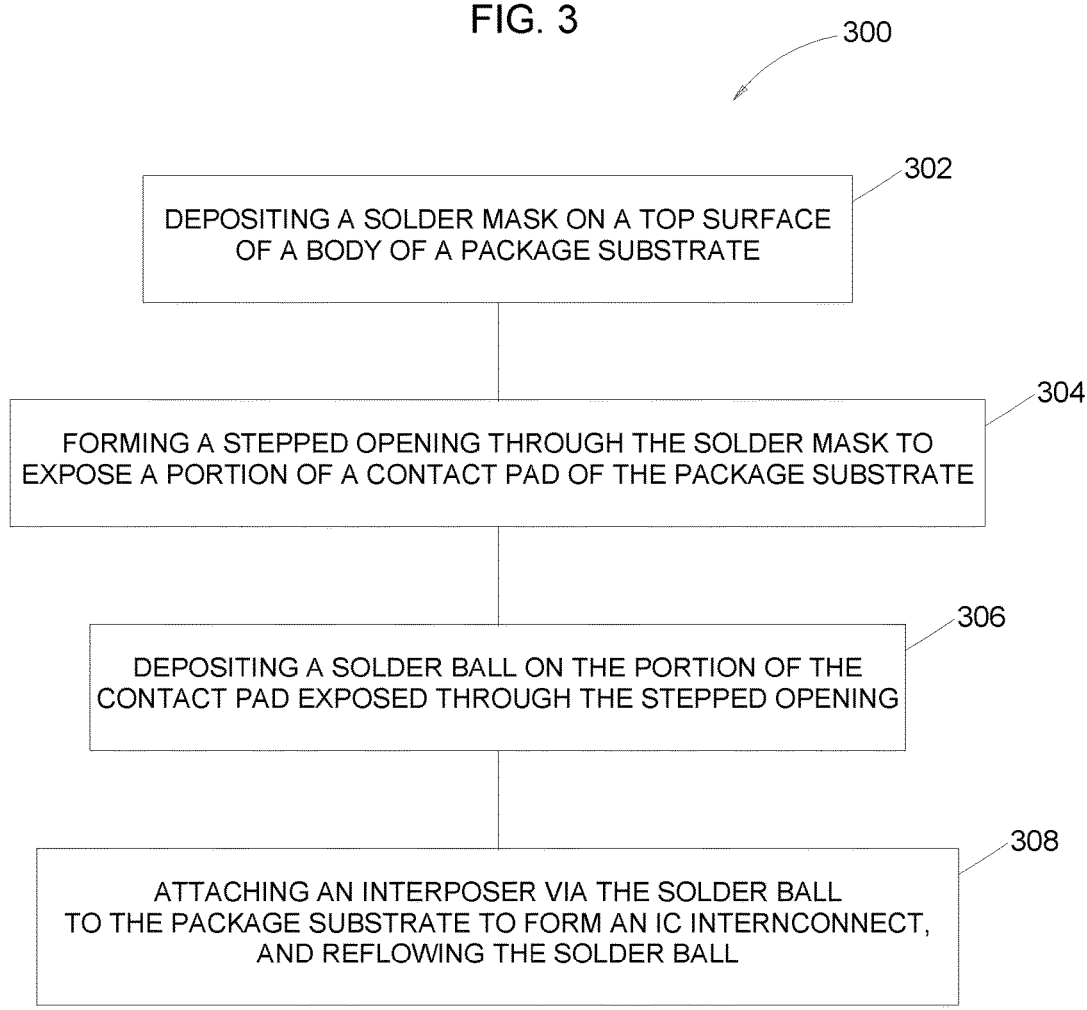
FIG. 3 is a flow diagram of a method for forming a chip package, such as the chip package depicted in FIG. 1 or other chip package incorporating an IC interconnect.

FIG. 3 is a flow diagram of a method 300 for forming a chip package, such as the chip package 110 depicted in FIG. 1 or other chip package incorporating an IC interconnect, such as the IC interconnect 132 depicted in FIG. 2. FIGS. 4A-D are sequential views of the chip package 110 during different stages of fabrication associated with the method 300.

Figure 4A:
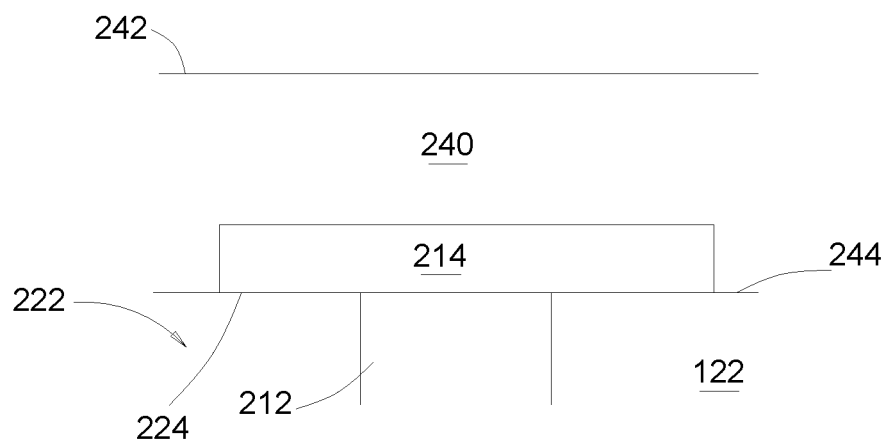
FIGS. 4A-D are sequential views of a chip package during different stages of fabrication.

Referring now to FIG. 3 and FIGS. 4A-D, the method 300 begins at operation 302 by depositing the solder mask 240 on the top surface 224 of the body 222 of the package substrate 122. The solder mask 240 is also deposited over the contact pad 214, as illustrated in FIG. 4A.

Figure 4B:
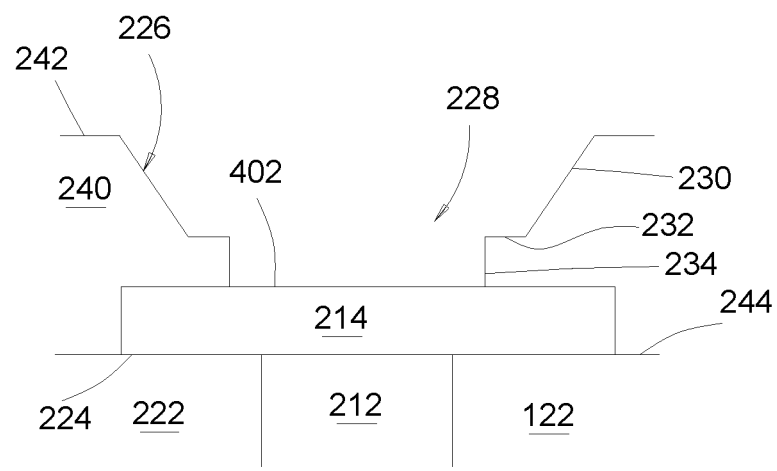

At operation 304, the stepped opening 226 is formed through the solder mask 240 to expose a portion 402 of the contact pad 214, as shown in FIG. 4B. The stepped opening 226 may be formed by any suitable material subtractive technique, such as photolithography or etching. In one example, the stepped opening 226 may be formed using a two-step removal (e.g., subtractive) process. In a two-step removal process, a first solder mask material removal operation may be utilized to form one of the sidewalls 230, 234, while a second solder mask material removal operation may be utilized to form the other one of the sidewalls 230, 234. The solder mask material removal operations may include separate patterning and etching operations. During the solder mask material removal operation that forms the first sidewall 230, the angle (i.e., the orientation) of the first sidewall 230 may be perpendicular or non-perpendicular relative to the plane of the top surface 224 of the body 222.

In the example depicted in FIG. 4B, the first sidewall 230 has a non-perpendicular orientation relative to the plane of the top surface 224. The non-perpendicular orientation of the first sidewall 230 resulting in the flaring of the first sidewall 230 towards the top surface 242 of the solder mask 240 may be generated using a variety of patterning techniques including, but not limited to, gray tone lithography, shadow masking, moving mask, controlling the photoacid distribution in the solder mask material, reflowing the solder mask material after initial patterning, and controlling the amount of anisotropic etching during formation of the first sidewall 230.

Alternatively at operation 304, the stepped opening 226 may be formed through the solder mask 240 utilizing a "leaky chrome" process. The "leaky chrome" process may use a mask, e.g., a reticle, having an opaque gradient mask region that may transmit a portion of incident radiation during exposure such that a gradient in the intensity received may be created.

Figure 4C:
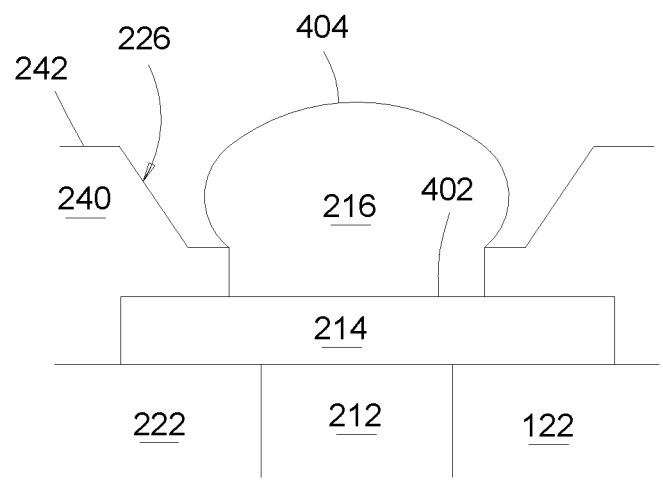

At operation 306, a solder ball 216 is deposited on the portion 402 of the contact pad 214 exposed through the stepped opening 226, as depicted in FIG. 4C. In the example depicted in FIG. 4C, a top 404 of the solder ball 216 is generally flush with or recessed below the top surface 242 of the solder mask 240. The solder ball 216 generally has a diameter larger than a diameter of the second sidewall 234 but smaller than a diameter of the first sidewall 230 where the first sidewall 230 meets the top surface 242 of the solder mask 240. Although the solder ball 216 is shown substantially flush with the top surface 242 of the solder mask 240, the top 404 of the solder ball 216 may extend beyond the top surface 242 of the solder mask 240 if desired.

Figure 4D:
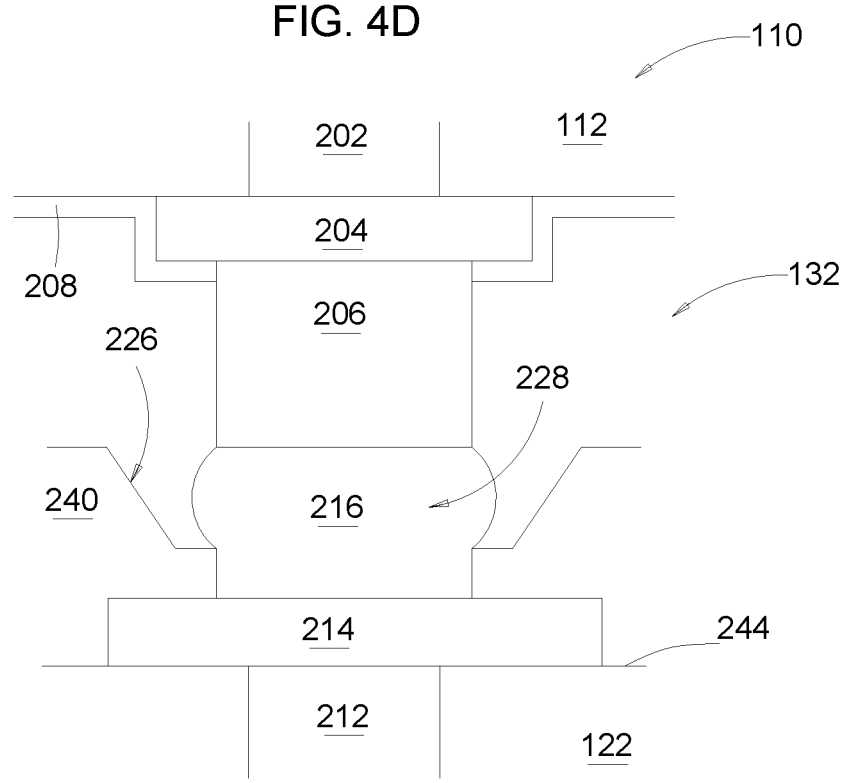

At operation 308, the interposer 112 is attached via the solder ball 216 to the package substrate 122 and the solder ball 216 is reflowed to robustly provide electrical and mechanical connection between the contact pad 214 of the package substrate 122 and the conductive pillar 206 of the interposer 112, as illustrated in FIG. 4D, thus forming the IC interconnect 132. Since the stepped opening 226 in the solder mask 240 is bigger than conventional processes, relatively less solder volume is need, which advantageously reduces the probability of necking due to solder wicking around the conductive pillar 206.

The IC interconnect 132 described above is particularly suitable for providing robust solder connections between the interposer 112 and the package substrate 122 at pitches as small as 144 μm. Advantageously, the IC interconnect 132 is resistant to necking, even after reflow. As illustrated above, the IC interconnect 132 may be formed without coining, thereby saving cost and process time over conventional solder interconnects. Since the IC interconnect 132 can be formed utilizing the same solder volume as conventional interconnects formed for 180 μm pitch applications, the IC interconnect 132 less prone to intermetallic (IMC) brittleness associated with reduced solder volume.

FIG. 5 is a partial sectional another embodiment of a method 500 for forming an IC interconnect. FIGS. 6A-E are sequential views of a portion of a chip package 610 during different stages of fabrication associated with the method 500 resulting in the formation of an IC interconnect 632 of a chip package 610 that couples an interposer 112 to a package substrate 122. The IC interconnect 632 may be utilized in place of the IC interconnect 132 in the chip package 110. The chip package 610 may be constructed as described above with reference to the chip package 110, with the exception of the description below describing techniques for forming the IC interconnect 632.

Referring now to FIG. 5 and FIGS. 6A-E, the method 500 begins at operation 502 by depositing a solder mask 240 that has at least two layers of photoimigable material. In the example depicted in FIG. 6A, operation 502 includes depositing a first layer 602 and a second layer 604 to form the solder mask 240. The first layer 602 is deposited on the top surface 224 of the body 222 of the package substrate 122. The first layer 602 of the solder mask 240 is also, but not required to be, deposited over and cover the contact pad 214. For example, a portion of the contact pad 214 may extend through the first layer 602. Operation 502 also includes depositing the second layer 604 of the solder mask material on the first layer 602 to form the multi-layer solder mask 240. The first and second layers 602, 604 of the solder mask 240 may have about equal thicknesses. It is contemplated that the solder mask 240 may optionally include more than layers of solder mask material.

At operations 504, 506, a stepped opening 226 is formed through the solder mask 240. At operation 504, a first portion 606 of the stepped opening 226 is formed through the second layer 604 of the solder mask 240. The first portion 606 of the stepped opening 226 exposes a portion 608 of the first layer 602, as shown in FIG. 6B.

The first portion 606 of the stepped opening 226 may be formed by any suitable technique. In one example, the first portion 606 of the stepped opening 226 may be formed using solder mask material removal operation that includes a patterning and an etching process to form the first sidewall 230. During the solder mask material removal operation that forms the first sidewall 230, the angle (i.e., the orientation) of the first sidewall 230 may be perpendicular or non-perpendicular relative to the plane of the top surface 224 of the body 222. The first sidewall 230 may be formed utilizing any of the subtractive techniques described above.

Figure 6A:
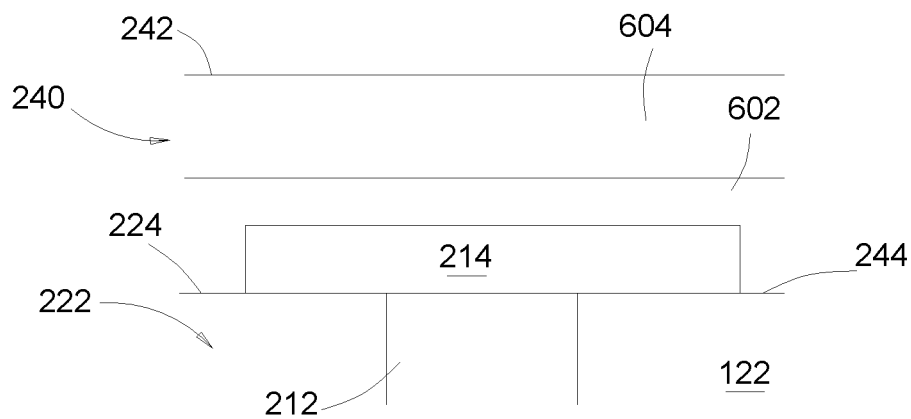
FIGS. 6A-E are sequential views of a chip package during different stages of fabrication.
Figure 6B:
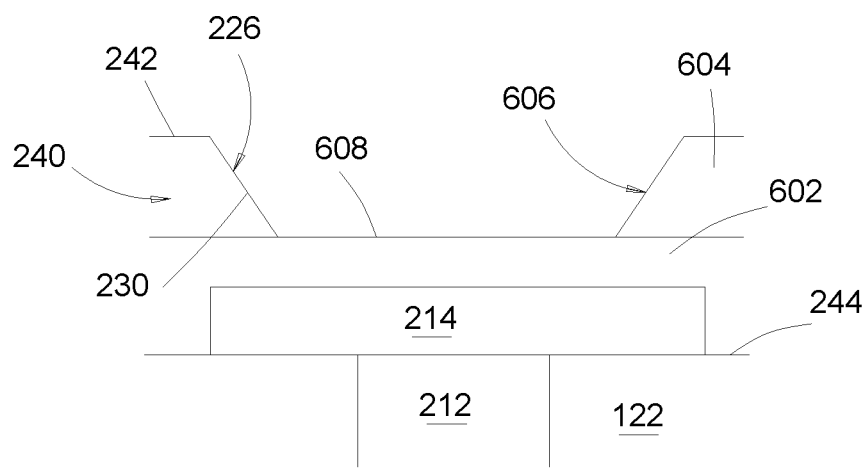

In the example depicted in FIG. 6B, the first sidewall 230 has a non-perpendicular orientation relative to the plane of the top surface 224. In particular, the first sidewall 230 flares outward towards the top surface 242 of the solder mask 240.

Figure 6C:
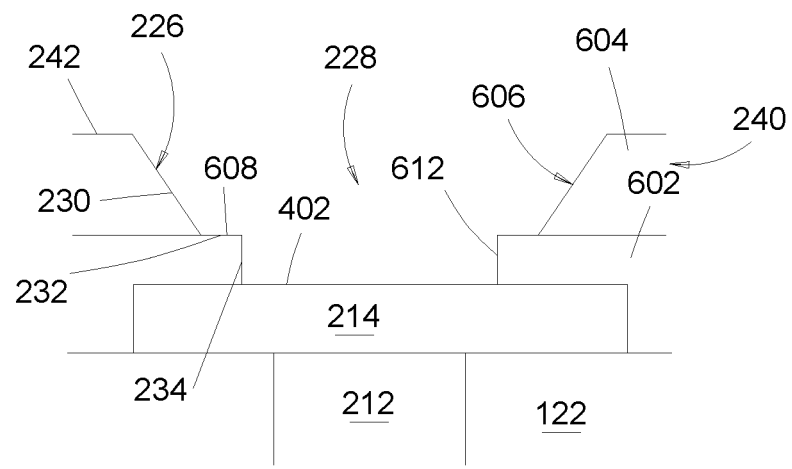

At operation 506, a second portion 612 of the stepped opening 226 is formed through the portion 608 of the first layer 602 of the solder mask 240. The second portion 612 of the stepped opening 226 exposes a portion 402 of the contact pad 214, as shown in FIG. 6C. The portion 608 of the first layer 602 not removed at operation 506 forms the step 232 of the stepped opening 226. Stated differently, the portion 608 of the first layer 602 remaining after operation 506 forms the step 232 of the stepped opening 226.

The second portion 612 of the stepped opening 226 may be formed by any suitable technique. In one example, the second portion 612 of the stepped opening 226 may be formed using solder mask material removal operation that includes a patterning and an etching process to form the second sidewall 234 and step 232. During the solder mask material removal operation that forms the first sidewall 230 and step 232, the angle (i.e., the orientation) of the second sidewall 234 may be perpendicular or non-perpendicular relative to the plane of the top surface 224 of the body 222. In the example depicted in FIG. 6C, the second sidewall 234 is perpendicular relative to the plane of the top surface 224 of the body 222. The second sidewall 234 may be formed utilizing any of the subtractive techniques described above.

Figure 6D:
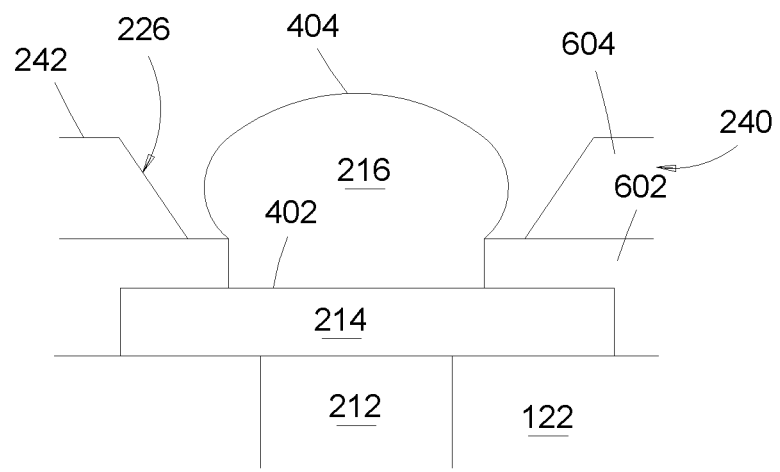

At operation 508, a solder ball 216 is deposited on the portion 402 of the contact pad 214 exposed through the opening 228 formed in the first layer 602 of the stepped opening 226, as depicted in FIG. 6D. In the example depicted in FIG. 6D, a top 404 of the solder ball 216 is generally flush with or recessed below the top surface 242 of the solder mask 240. The solder ball 216 generally has a diameter larger than a diameter of the second sidewall 234 but smaller than a diameter of the first sidewall 230 where the first sidewall 230 meets the top surface 242 of the solder mask 240. Although the solder ball 216 is shown substantially flush with the top surface 242 of the solder mask 240, the top 404 of the solder ball 216 may extend beyond the top surface 242 of the solder mask 240 if desired.

Figure 6E:
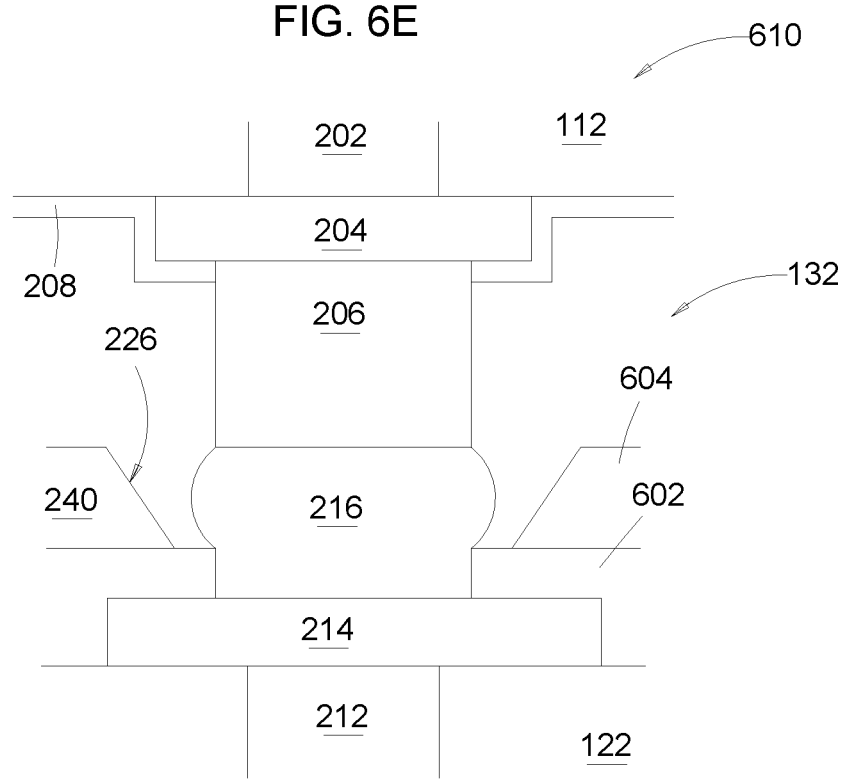

At operation 510, the interposer 112 is attached via the solder ball 216 to the package substrate 122 and the solder ball 216 is reflowed to robustly provide electrical and mechanical connection between the contact pad 214 of the package substrate 122 and the conductive pillar 206 of the interposer 112, as illustrated in FIG. 6E, thus forming the IC interconnect 632. The IC interconnect 632 provides the identical advantages as the IC interconnect 132 described above.

The chip package 110, as fabricated using an IC interconnect 132, IC interconnect 632 or other similarly constructed IC interconnect, may be utilized in an electronic device, such as the electronic device 100 described above. The IC interconnects 132, 632 described above advantageously provide robust solder connections between interposers and package substrates, thus improving performance, cost and reliable of chip packages fabricated with such interconnects. By reducing the probability of necking, cracking and IMC brittleness, the IC interconnects described above may be readily implemented at pitches down to 144 μm at a minimal cost, thereby advantageously increasing reliability, device yield and performance.

While the foregoing is directed to embodiments of the present invention, other and further embodiments of the invention may be devised without departing from the basic scope thereof, and the scope thereof is determined by the claims that follow.

What is claimed is:

1. An integrated circuit interconnect comprising:
    a package substrate having a top side, the package substrate comprising:
        a body;
        a plurality of contact pads disposed on the body;
        circuitry disposed in the package substrate and coupled to the plurality of contact pads; and
        a solder mask disposed on the body and defining the top side of the package substrate, the solder mask being a single layer of solder mask material, the solder mask having a plurality of stepped openings through the single layer of solder mask material to the contact pads, wherein for each of the stepped openings, a step of the single layer of solder mask material at least partially defines the respective stepped opening, at least a portion of the step of the single layer of solder mask material being disposed directly above a respective one of the contact pads; and
    a plurality of solder balls, each solder ball disposed in a respective one of the plurality of stepped openings formed in the solder mask and disposed in contact with a respective one of the plurality of contact pads.

2. The integrated circuit interconnect of claim 1 further comprising:
    an interposer coupled to the package substrate via the solder balls.

3. The integrated circuit interconnect of claim 1, wherein each of the stepped openings comprise:
    a first sidewall, a first opening diameter of the respective one of the stepped openings being at the first sidewall; and
    a second sidewall adjacent the respective one of the contact pads, a second opening diameter of the respective one of the stepped openings being at the second sidewall, the first opening diameter being greater than the second opening diameter, the second opening diameter being less than a diameter of the respective one of the contact pads, the second sidewall disposed between the first sidewall and the respective one of the contact pads.

4. The integrated circuit interconnect of claim 3, wherein the first sidewall is flared.

5. The integrated circuit interconnect of claim 3, wherein each of the solder balls has a diameter larger than the second opening diameter but smaller than the first opening diameter.

6. A method for forming an interconnect of an integrated circuit package, the method comprising:
depositing a solder mask on a body of a package substrate, the package substrate comprising contact pads coupled to circuitry within the body of the package substrate;
forming a stepped opening through the solder mask to expose one of the contact pads, a first opening diameter of the stepped opening at the one of the contact pads being less than a second opening diameter of the stepped opening at an exterior of the package substrate;
depositing a solder ball in the stepped opening, the solder ball electrically coupled to the one of the contact pads; and
attaching the solder ball to a pillar on an interposer, attaching the solder ball comprising reflowing the solder ball, wherein after reflowing the solder ball, a diameter of the solder ball is less than the second opening diameter of the stepped opening.

7. The method of claim 6, wherein forming the stepped opening comprises forming a flared sidewall of the solder mask to at least partially define the stepped opening, forming the flared sidewall comprising performing a leaky chrome photolithography process.

8. The method of claim 6, wherein depositing the solder mask comprises:
depositing a first solder mask layer on the body; and
depositing a second solder mask layer on the first solder mask layer, the second solder mask layer defining the exterior of the package substrate.

9. The method of claim 8, wherein forming the stepped opening through the solder mask comprises:
forming a first sidewall of the stepped opening through the first solder mask layer, the first opening diameter being at the first sidewall; and
forming a second sidewall of the stepped opening through the second solder mask layer, the second opening diameter being at the second sidewall.

10. The method of claim 9, wherein forming the second sidewall of the stepped opening comprises:
forming a flared sidewall.

11. The method of claim 6, wherein forming the stepped opening through the solder mask comprises:
forming the stepped opening in a single layer of solder mask material.

12. The method of claim 11, wherein forming the stepped opening comprises:
forming a first sidewall adjacent the one of the contact pads, the first opening diameter being at the first sidewall; and
forming a second sidewall distal from the one of the contact pads, the second opening diameter being at the second sidewall, the first sidewall disposed between the second sidewall and the one of the contact pads.

13. The method of claim 12, wherein forming the second sidewall further comprises forming a flared sidewall.

14. A package structure comprising:
a package substrate comprising:
a package contact pad on a body; and
a solder mask on the body and defining an exterior of the package substrate, a stepped opening being through the solder mask to the package contact pad, a first opening diameter of the stepped opening at the package contact pad is less than a second opening diameter of the stepped opening at the exterior of the package substrate;
an interposer comprising:
an interposer contact pad; and
a pillar disposed on and extending from the interposer contact pad; and
a solder ball attached to the package contact pad through the stepped opening and to the pillar, a largest diameter of the solder ball being less than the second opening diameter.

15. The package structure of claim 14, wherein the solder mask comprises:
a first solder mask layer disposed on the body; and
a second solder mask layer disposed on the first solder mask layer, the second solder mask layer defining the exterior of the package substrate.

16. The package structure of claim 15, wherein the stepped opening through the solder mask is defined at least in part by:
a first sidewall through the first solder mask layer, the first opening diameter being at the first sidewall; and
a second sidewall through the second solder mask layer, the second opening diameter being at the second sidewall.

17. The package structure of claim 16, wherein the second sidewall is flared toward the exterior of the package substrate.

18. The package structure of claim 14, wherein the solder mask is a single layer of solder mask material, the stepped opening being through the single layer of solder mask material.

19. The package structure of claim 18, wherein the stepped opening is defined at least in part by:
a first sidewall adjacent the package contact pad, the first opening diameter being at the first sidewall; and
a second sidewall distal from the package contact pad, the second opening diameter being at the second sidewall.

20. The package structure of claim 19, wherein the second sidewall is flared toward the exterior of the package substrate.

* * * * *